(12) United States Patent
Roberts et al.

(10) Patent No.: US 8,422,311 B1
(45) Date of Patent: Apr. 16, 2013

(54) EPROM ERASING APPARATUS AND METHOD FOR ERASING AN EPROM(S)

(75) Inventors: Marion Joseph Roberts, Ridgecrest, CA (US); Timothy Mark Ochoa, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 336 days.

(21) Appl. No.: 12/847,184

(22) Filed: Jul. 30, 2010

(51) Int. Cl.
*G11C 16/04* (2006.01)

(52) U.S. Cl.
USPC ............ 365/185.29; 365/185.02; 365/185.24

(58) Field of Classification Search ............. 365/185.29, 365/185.02, 185.24, 185.25
See application file for complete search history.

(56) References Cited

U.S. PATENT DOCUMENTS

| | | | | |
|---|---|---|---|---|
| 4,858,219 | A * | 8/1989 | Yoshikawa | ..................... 369/116 |
| 6,686,097 | B2 * | 2/2004 | Lahrichi | .......................... 430/1 |
| 7,898,873 | B2 * | 3/2011 | Chen et al. | ............... 365/185.29 |

* cited by examiner

*Primary Examiner* — Connie Yoha
(74) *Attorney, Agent, or Firm* — Christopher L. Blackburn

(57) ABSTRACT

A EPROM erasing apparatus and method for erasing an EPROM(s). The EPROM(s) is erased using light emitted from an ultraviolet light emitting diode.

20 Claims, 1 Drawing Sheet

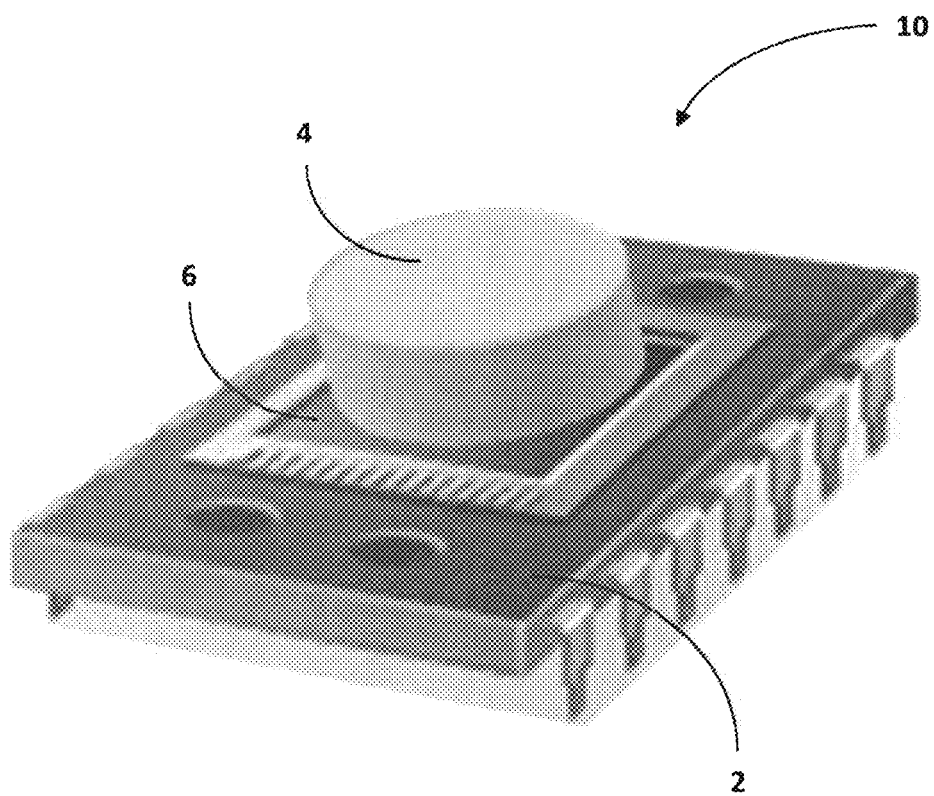

EPROM ERASING APPARATUS AND METHOD FOR ERASING AN EPROM(S)

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to an EPROM data erasing apparatus and method for erasing the data stored on an EPROM.

BRIEF DESCRIPTION OF THE DRAWING

FIG. 1 is a perspective view of an EPROM package and ultraviolet light emitting diode combination according to some embodiments of the invention.

It is to be understood that the foregoing and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION

An erasable programmable read only memory ("EPROM") is a type of memory chip that retains its data when its power supply is switched off. In other words, it is "non-volatile". As used herein, the term EPROM includes electrically erasable programmable read only memory.

Apparatus 10 embodiments of the invention include an EPROM that is housed in an EPROM package 2. The EPROM package 2 has an aperture (through which light emitting from the ultraviolet light emitting diode 4 enters) that is in some embodiments covered by a transparent quartz window 6; in other embodiments, the ultraviolet light emitting diode 4 covers the aperture (in which case a transparent quartz window 6 is not used).

Apparatus embodiments of the invention also include an ultraviolet light emitting diode 4. The ultraviolet light emitting diode 4 can be any ultraviolet light emitting diode 4 capable of emitting sufficient light (photons) at a wavelength(s) to cause erasure of data stored on the EPROM.

In some embodiments, the wavelength of the light emitted from the ultraviolet light emitting diode 4 is about 254 nanometers; however, in other embodiments, the wavelength of the ultraviolet light emitting diode 4 can be a wavelength other than about 254 nanometers as long as the wavelength of the light emitted from the ultraviolet light emitting diode 4 is less than about 400 nanometers.

The ultraviolet light emitting diode 4 is oriented and located such that the EPROM receives sufficient photons (emitted from the ultraviolet light emitting diode) to cause erasure of data stored on said EPROM.

In some embodiments, the ultraviolet light emitting diode 4 is physically associated with the EPROM package 2, such as, for example, by affixing the ultraviolet light emitting diode 4 to the EPROM package 2 using: 1) an adhesive, for example, epoxy; 2) a fastener; and/or 3) mechanically securing the ultraviolet light emitting diode 4 to the EPROM package 2, such as, for example, using a clamp. In other embodiments, the ultraviolet light emitting diode 4 is not physically associated with the EPROM package 2.

In some embodiments, the ultraviolet light emitting diode 4 is in direct physical contact with the transparent quartz window 6 of the EPROM package 2. In another embodiment(s), in which the ultraviolet light emitting diode 4 covers the aperture in the EPROM package 2, the ultraviolet light emitting diode 4 provides the dual utility of providing light and covering the aperture in the EPROM package 2, in which case a transparent quartz window 6 is not used. In other embodiments, the ultraviolet light emitting diode 4 is not in direct physical contact with the EPROM package 2 at all.

In some embodiments (not illustrated), a focusing means (such as, for example a quartz lens, micro-lens array, or polycarbonate lens) is used to focus the light emitted from the ultraviolet light emitting diode 4 through the aperture onto the EPROM.

Method embodiments of the invention include providing an EPROM housed in an EPROM package 2. The EPROM package 2 has an aperture (through which light emitting from the ultraviolet light emitting diode 4 enters) that is in some embodiments covered by a transparent quartz window 6; in other embodiments, the ultraviolet light emitting diode 4 covers the aperture (in which case a transparent quartz window 6 is not used).

Method embodiments of the invention also include providing an ultraviolet light emitting diode 4. The ultraviolet light emitting diode 4 can be any ultraviolet light emitting diode 4 capable of emitting sufficient light (photons) at a wavelength(s) to cause erasure of data stored on the EPROM.

The ultraviolet light emitting diode 4 is oriented and located such that the EPROM receives sufficient photons (emitted from the ultraviolet light emitting diode 4) to cause erasure of data stored on the EPROM. Some method embodiments of the invention include physically associating the ultraviolet light emitting diode 4 with the EPROM package 2; however, in some other method embodiments of the invention, the ultraviolet light emitting diode 4 is not physically associated with the EPROM package 2.

Some method embodiments of the invention include locating the ultraviolet light emitting diode 4 in direct physical contact with the transparent quartz window 6 of the EPROM package 2. Other method embodiments of the invention include physically associating the ultraviolet light emitting diode 4 with the EPROM package 2 such that the ultraviolet light emitting diode 4 covers the aperture in the EPROM package 2. In yet other embodiments, the ultraviolet light emitting diode 4 is not in direct physical contact with the EPROM package 2 (including a transparent quartz window 6).

Some embodiments of the invention further include fixedly mounting the EPROM package 2 on a circuit board by any known means, such as, for example, soldering. However, in some embodiments, the EPROM package 2 is not fixedly mounted on a circuit board.

Some method embodiments of the invention include causing the ultraviolet light emitting diode 4 to emit sufficient light to erase data stored on the EPROM by providing electric current to the ultraviolet light emitting diode 4. The electric current can be supplied from any source that provides an electric current sufficient to cause the ultraviolet light emitting diode 4 to emit light at a frequency below about 400 nanometers for a sufficient amount of time to cause erasure of the data stored on the EPROM. A few possibilities for an electric power source (that could be used to provide electric current to the ultraviolet light emitting diode) include, but are not limited to: 1) integrating the LED within the EPROM package, 2) power from the circuit board, and 3) battery power.

In some method embodiments of the invention, erasure of data stored on the EPROM is accomplished by providing electric current to the ultraviolet light emitting diode 4 and without removing the EPROM package 2 from contact with the circuit board; however, in other method embodiments of the invention, erasure of data stored on the EPROM is accomplished by providing electric current to the ultraviolet emitting diode 4 while the EPROM is not physically associated with a circuit board.

While embodiments of the invention have been described, disclosed, illustrated and shown in various terms of certain embodiments, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An EPROM erasing apparatus comprising:
   at least one EPROM being housed in an EPROM package, said EPROM package having at least one aperture; and
   an ultraviolet light emitting diode, said ultraviolet light emitting diode adapted to emit light at a frequency below about 400 nanometers for a sufficient amount of time to cause erasure of data stored on said at least one EPROM, and said ultraviolet light emitting diode being oriented and located such that said EPROM receives sufficient flux to cause erasure of data stored on said EPROM.

2. The apparatus of claim 1 wherein said at least one aperture in said EPROM package is covered by a quartz window.

3. The apparatus of claim 1 wherein said at least one aperture in said EPROM package is covered by said ultraviolet light emitting diode.

4. The apparatus of claim 1 wherein said ultraviolet light emitting diode is physically associated with said EPROM package.

5. A method of erasing an EPROM comprising:
   providing at least one EPROM housed in an EPROM package, said EPROM package having at least one aperture;
   providing a ultraviolet light emitting diode that emits sufficient flux, and is oriented and located, such that when sufficient power is provided to said ultraviolet light emitting diode, said flux from said ultraviolet light emitting diode causes erasure of data on said EPROM; and
   providing an electric power source to supply electric current to said ultraviolet light emitting diode sufficient to cause said ultraviolet light emitting diode to emit light at a frequency below about 400 nanometers for a sufficient amount of time to cause erasure of data stored on said at least one EPROM.

6. The method of claim 5 further comprising providing a quartz window that covers said at least one aperture.

7. The method of claim 5 further comprising mounting said ultraviolet light emitting diode on said EPROM package.

8. The method of claim 5 wherein said ultraviolet light emitting diode is in direct physical contact with said transparent quartz window.

9. The method of claim 7 wherein said ultraviolet light emitting diode completely covers said aperture.

10. The method of claim further comprising fixedly mounting said EPROM package on a circuit board.

11. The method of claim 7 further comprising fixedly mounting said EPROM package on a circuit board.

12. The method of claim 8 further comprising fixedly mounting said EPROM package on a circuit board.

13. The method of claim 9 further comprising fixedly mounting said EPROM package on a circuit board.

14. The method of claim 10 further comprising causing said ultraviolet light emitting diode to emit sufficient light to erase data stored on said at least one EPROM by providing electric current to said ultraviolet light emitting diode.

15. The method of claim 11 further comprising causing said ultraviolet light emitting diode to emit sufficient light to erase data stored on said at least one EPROM by providing electric current to said ultraviolet light emitting diode.

16. The method of claim 12 further comprising causing said ultraviolet light emitting diode to emit sufficient light to erase data stored on said at least one EPROM by providing electric current to said ultraviolet light emitting diode.

17. The method of claim 10 further comprising erasing data stored on said at least one EPROM by providing electric current to said ultraviolet light emitting diode and without removing said EPROM package from contact with said circuit board.

18. The method of claim 11 further comprising erasing data stored on said at least one EPROM by providing electric current to said ultraviolet light emitting diode and without removing said EPROM package from contact with said circuit board.

19. The method of claim 12 further comprising erasing data stored on said at least one EPROM by providing electric current to said ultraviolet light emitting diode and without removing said EPROM package from contact with said circuit board.

20. The method of claim 13 further comprising erasing data stored on said at least one EPROM by providing electric current to said ultraviolet light emitting diode and without removing said EPROM package from contact with said circuit board.

\* \* \* \* \*